United States Patent [19]

Tanabe et al.

[11] Patent Number: 4,780,846
[45] Date of Patent: Oct. 25, 1988

[54] MASTER SLICE TYPE SEMICONDUCTOR CIRCUIT DEVICE

[75] Inventors: Tomoaki Tanabe; Shigeru Fujii, both of Yokohama; Yoshihisa Takayama, Kawasaki, all of Japan

[73] Assignee: Fujitsu Limited, Kawasaki, Japan

[21] Appl. No.: 750,163

[22] Filed: Jun. 28, 1985

[30] Foreign Application Priority Data

Jul. 2, 1984 [JP] Japan ............................... 59-135210
Jul. 2, 1984 [JP] Japan ............................... 59-135214

[51] Int. Cl.⁴ ............................................. G11C 5/06
[52] U.S. Cl. ..................................... 365/63; 365/189; 357/45; 307/465
[58] Field of Search ............. 365/63, 174, 104, 51, 365/72, 226; 357/45, 46, 40; 307/465, 468, 469; 340/825.86, 825.79

[56] References Cited

U.S. PATENT DOCUMENTS

| 4,255,672 | 3/1981 | Ohno et al. | 357/45 |
| 4,523,106 | 6/1985 | Tanizawa et al. | 357/45 |
| 4,525,809 | 6/1985 | Chiba et al. | 365/63 |
| 4,660,174 | 4/1987 | Takemae et al. | 365/63 |

FOREIGN PATENT DOCUMENTS 3326943 2/1984 Fed. Rep. of Germany ........ 365/63
59-19367 1/1984 Japan .

Primary Examiner—Stuart N. Hecker
Assistant Examiner—Glenn A. Gossage
Attorney, Agent, or Firm—Staas & Halsey

[57] ABSTRACT

A master slice type semiconductor circuit device including a memory block having at least one memory circuit; one conductive layer provided to peripheral portions of the memory circuit and used as an input portion thereto; power source lines provided to the peripheral portion of the memory circuit and formed by a conductive layer different from the conductive layer of the input portion; and a contact hole for connecting between the two conductive layers at a selected input portion. The selected input portion connected by the contact hole is set or clamped to a predetermined logic level by the power source line. This enables a change of the memory capacity or the function of the memory block to satisfy customer requirements.

24 Claims, 13 Drawing Sheets

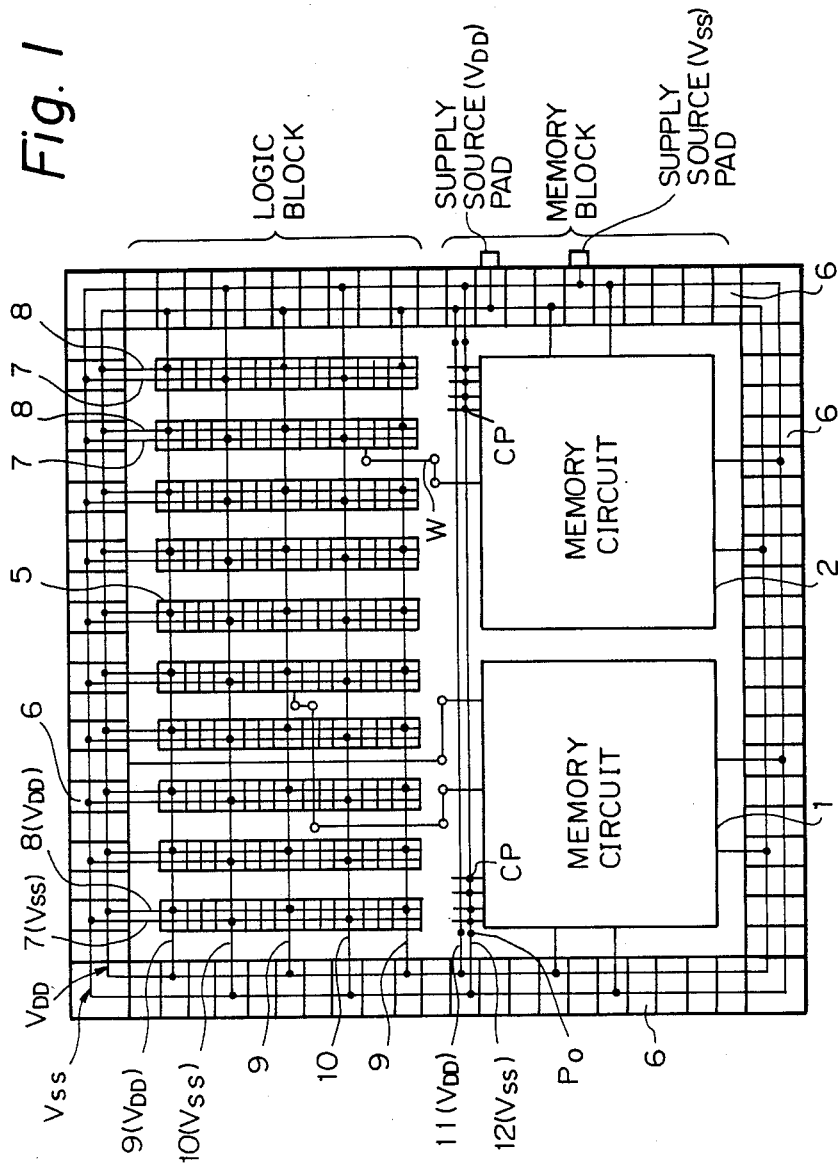

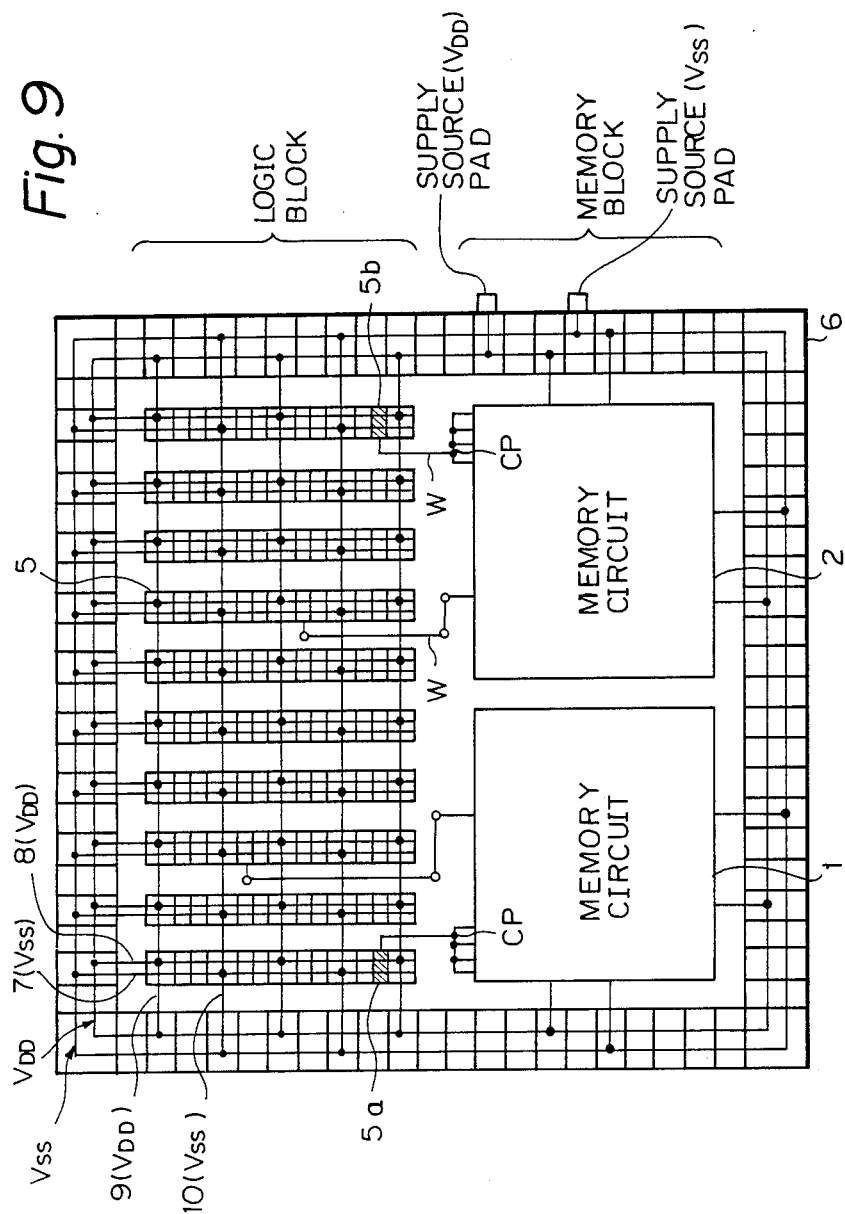

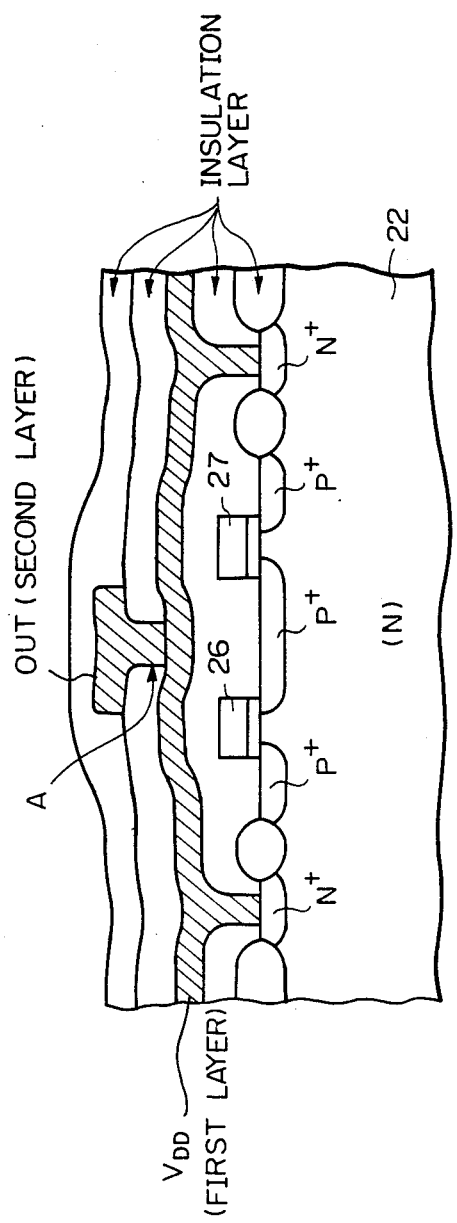

MASTER SLICE TYPE SEMICONDUCTOR CIRCUIT DEVICE

BACKGROUND OF THE INVENTION

1. Field of the Invention

The present invention relates to a master slice type semiconductor circuit device. More particularly, it relates to a gate array type large-scale integrated circuit device (gate array LSI) made of a master slice type semiconductor circuit device. The gate array LSI according to the present invention includes a logic block consisting of a plurality of basic gate circuit cells and memory circuits each consisting of a plurality of memory cells.

2. Description of the Related Art

A master slice type simiconductor circuit device is designed to facilitate short-run production meeting diverse customer requirements and is utilized, for example, for gate array LSI's.

In a master slice production method, a set of common processes are used to manufacture a master substrate for use in forming what will later be a variety of semiconductor devices. The master substrate is basically a plurality of basic cells, each cell consisting of transistors. The gate electrodes, sources, and drains of the transistors are uniformly formed on the master substrate. No wiring between the basic cells is provided at this time.

In the succeeding slice process, wiring is produced on the master substrate by using a wiring mask pattern. The wiring mask pattern is designed by a computer aided design (CAD) system to meet customer requirements.

In a gate array LSI, the basic cells, each consisting of a basic circuit, are arranged in a grid. The wiring between the basic cells is also designed by computer according to the logic circuit required by the customer. Recently, however, it has been proposed to provide specific memory blocks in a gate array LSI in addition to logic blocks. There are many problems with such a gate array LSI. First, there is limited flexibility in design since the capacity and circuit arrangement of such a memory circuit are set when the master slice is first produced and the capacity cannot be changed to meet customer requirements. Second, the wiring area is not effectively utilized, which obstructs miniaturization. To obtain a highly integrated gate array, it is important to minimize the wiring area and shorten the wiring length.

SUMMARY OF THE INVENTION

The primary object of the present invention is to provide a master slice type semiconductor circuit device facilitating a design according to customer requirements.

Another object of the present invention is to provide an improved gate array LSI using a master slice type semiconductor circuit device having a logic block consisting of a plurality of basic gate circuit cells and memory circuits each consisting of a plurality of memory cells.

Still another object of the present invention is to provide a method for clamping input terminals of the memory circuit in the gate array LSI in accordance with customer requirements to obtain the desired memory capacity.

In accordance with the present invention, there is provided a master slice type semiconductor circuit device including; at least one memory circuit block having a plurality of input circuits; a plurality of input lines provided to a peripheral portion of the memory circuit block and connected to the input circuits respectively for receiving input signals, the input lines being formed by a first conductive layer; a first conductive line provided to the peripheral portion of the memory circuit block for supplying a first logic level; a second conductive line provided to the peripheral portion of the memory circuit block for supplying a second logic level, the first and second conductive lines being formed by a second conductive layer which is a different layer from the first conductive layer; and contact means for connecting the first or second conductive lines to at least one of the input lines; a potential of at least one of the input signals being clamped to the first or second logic level by the contact means, thereby enabling a change in the memory capacity or a function of the memory circuit block.

BRIEF DESCRIPTION OF THE DRAWINGS

In the figures;

FIG. 1 is a schematic view of a gate array LSI according to an embodiment of the present invention;

FIG. 9 is a schematic view of a gate array LSI according to still another embodiment of the present invention;

FIG. 10B is a sectional view of the stacked gates taken along line E—E' in FIG. 10A;

DESCRIPTION OF THE PREFERRED EMBODIMENTS

Figure 2A:
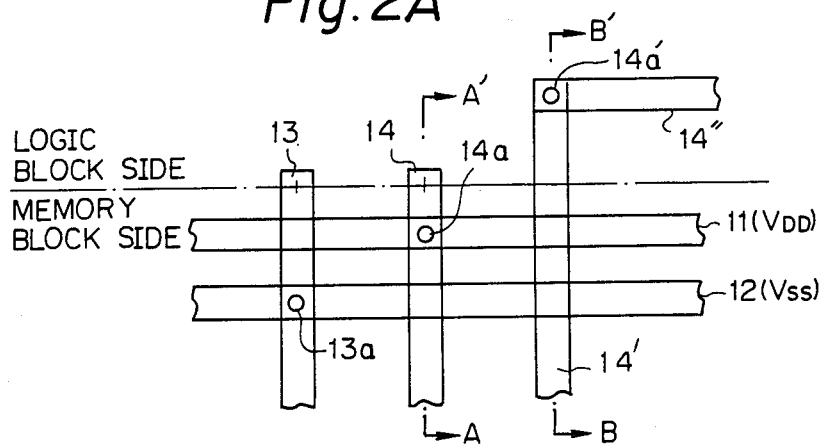
FIG. 2A is an enlarged view of input terminals and power source lines.

In the master slice type semiconductor circuit device according to the present invention, power source lines for clamping are formed in the same process as the gate electrode of the transister, that is, the lines are previously and uniformly formed on the master substrate. Accordingly, as explained in detail hereinafter, it is possible to easily obtain the wiring pattern and memory capacity or function required by a customer by just determining the position of contact holes.

A gate array LSI formed by the master slice method according to the present invention will be explained in detail hereinafter.

FIG. 1 is a schematic view of the gate array LSI device on a semiconductor chip according to an embodiment of the present invention. In FIG. 1, reference numerals 1 and 2 represent memory circuits, each consisting of a random-access memory (RAM) or read-only memory (ROM). These memory circuits 1 and 2 constitute a memory block. Reference numerals 5 represent basic cells. A plurality of these basic cells arranged in a grid constitutes a logic block. An input/output buffer circuit 6 is provided to the peripheral portion of these logic and memory blocks. Power lines $V_{DD}$ and $V_{SS}$ are provided in the buffer circuit 6. These lines are connected to the supply source pads.

Reference numerals 7, 8, 9, and 10 are power source lines provided to each of the basic cells in the logic block. These power source lines are connected to the supply source pads through the power lines $V_{DD}$ and $V_{SS}$. The power source lines 7 and 10 are used for supplying a source voltage $V_{SS}$, for example, 0(V). The power source lines 8 and 9 are used for supplying a source voltage $V_{DD}$, for example, 5(V). The lines 7 and 8 in the longitudinal direction are formed by the aluminum wiring of a first conductive layer, and lines 9 and 10 in the transverse direction are formed by the aluminum wiring of a second conductive layer arranged over the first conductive layer and connections are made therebetween through an insulation layer. The circuits of the basic cells are formed under the first conductive layer and connected through the insulation layer. These structures are shown in detail by sectional views hereinafter.

Reference numerals 11 and 12 are also power source lines, but these lines are formed by a gate conductive layer disposed under the first conductive layer. The gate conductive layer is also used to form the gate electrode of the transistor of the basic cell. These lines 11 and 12 are disposed under the first conductive layer and connections made through the insulation layer to the power lines $V_{DD}$ and $V_{SS}$ through contact points $P_0$.

In the above-mentioned structure, the wiring between the basic cells in the logic block and between the logic block and the memory block is determined by a computer aided design (CAD) system based on the logic circuit required by the customer. In this case, the selected input terminals of an input portion of each memory circuit are clamped to the predetermined first or second logic level in correspondence with the memory capacity required. That is, a potential of the selected input terminal is equal to the predetermined first or second logic level. "Clip" or "clamp" means to set the selected input terminal of the memory circuit to the predetermined first or second logic level by using a contact hole as contact means, as explained in detail hereinafter. Accordingly, the clipped input terminals are no longer used as input terminals of the input portion in the memory circuit, and the memory areas connected to the clipped input terminals are no longer used as memory areas.

In FIG. 1, four clamped points CP are shown on the line 12 in the memory circuit 1 and four on the line 12 in the memory 2. In this case, these eight selected input terminals are clamped to the source voltage $V_{SS}$ as the second logic level.

FIG. 2A is an enlarged view of input terminals and power source lines. In FIG. 2A, reference numerals 13, 14, and 14' represent input terminals provided to the memory circuit 1 or 2. The terminal 13 is clamped to the power source line 12 at the contact hole 13a, and the input terminal 14 is clamped to the power source line 11 at the contact hole 14a. The input terminal 14' is not clamped and is thus connected to the wiring 14" through the contact hole 14a'. This wiring 14" is connected to the basic cell in the logic block.

As explained above, the input terminals 13, 14, and 14' are formed by the aluminum wiring of the first conductive layer, and the wiring 14" is formed by the aluminum wiring of the second conductive layer. The power source lines 11 and 12 are formed by the gate conductive layer. Accordingly, the contact holes 13a and 14a are used for connecting the first conductive layer and the gate conductive layer, and the contact hole 14a' is used for connecting the first conductive layer and the second conductive layer.

Figure 2B:
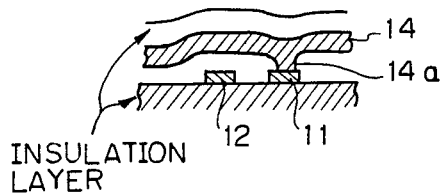
FIG. 2B is a sectional view of the input terminal taken along line A—A' in FIG. 2A.

FIG. 2B is a sectional view of the terminal 14 taken along line A—A' in FIG. 2A. As is obvious from the drawing, the input terminal 14 is connected (clamped) to the power source line 11 through the contact hole 14a. The input terminal 13 has the same sectional view as the input terminal 14.

Figure 2C:
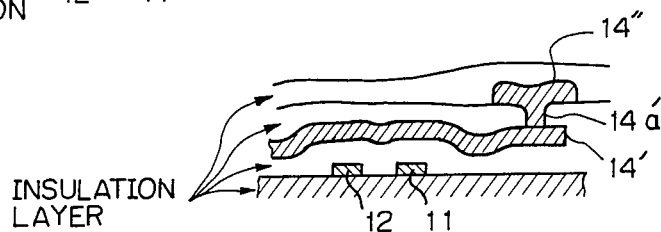
FIG. 2C is a sectional view of the input terminal taken along line B—B' in FIG. 2A.

FIG. 2C is a sectional view of the input terminal 14' taken along line B—B' in FIG. 2A. In this case, the input terminal 14' is not connected to either of the power source lines 11 or 12. The input terminal 14' is connected to the wiring 14" through the contact hole 14a'.

Figure 2D:
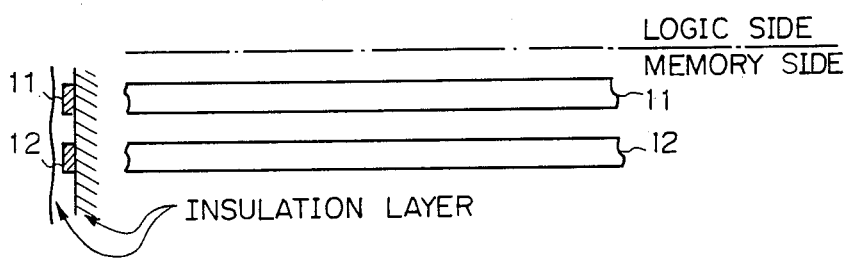
FIG. 2D is a schematic plan and sectional view of power source lines shown in FIG. 2A.

FIG. 2D is a schematic plan and sectional view of the power source lines 11 and 12 formed by the gate conductive layer shown in FIG. 2A. These power source lines 11 and 12 are formed in advance using the master slice method, i.e., are formed by the same process as the gate conductive layer of the gate electrode of the transistor.

Figure 3:
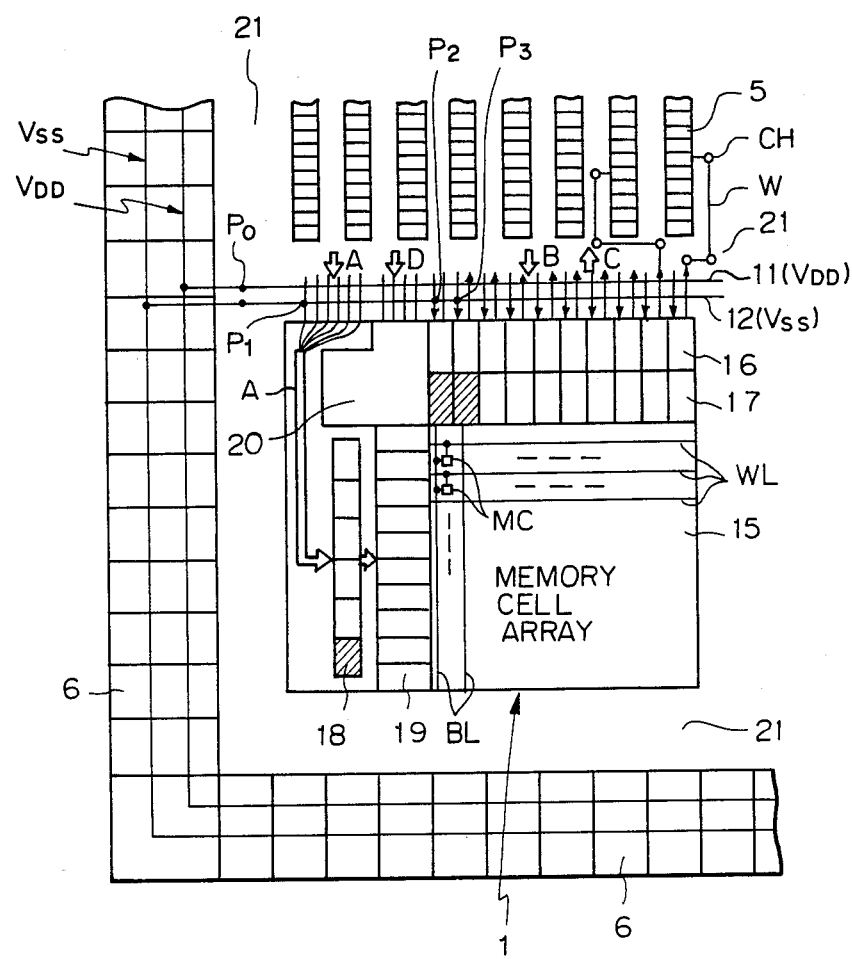
FIG. 3 is a detailed partial view of the memory circuit shown in FIG. 1.

FIG. 3 is a detailed partial view of the memory circuit shown in FIG. 1. In FIG. 3, the memory circuit 1 includes a memory cell array comprised of a plurality of memory cells (MC), each of which is connected to a word line (WL) and a bit line (BL) (in case of a dual port type memory cell, a pair of word and bit lines are used), a sense amplifier group 16 constituted of a plurality of sense amplifiers used for reading data, a write amplifier group 17 constituted of a plurality of write amplifiers used for writing data, a word address register group 18 constituted of a plurality of word address registers, a word decoder group 19 constituted of a plurality of word decoders, and a control circuit 20. Reference numerals 11 and 12 are power source lines each of which is made of, for example, polycrystalline silicon, as explained above. These power source lines 11 and 12, as first and second conductive lines, are connected to main power lines $V_{DD}$ and $V_{SS}$ in the input-/output buffer 6 through contact points $P_0$. Accordingly, the layer of the main power lines is connected to the layer of power source lines 11 and 12 by contact holes at the points $P_0$. Reference numeral 21 represents the wiring area. Each basic cell is connected to a corresponding input or output terminal of the memory circuit 1 through the wiring W and the contact hole CH in the wiring area 21. As explained above, the wiring W is formed by aluminum wiring, and the contact hole CH is used for connecting the second layer and the first layer of the wiring W.

Reference character A represent an address signal, B write data, C read data, and D a control signal having a clock signal and a write enable signal. The address signal A is input into the word address register group 18, the write data B is input into the write amplifier group 17, and the read data C is output from the sense amplifier group 16. The control signal D is input into the control circuit.

In FIG. 3, points $P_1$, $P_2$, and $P_3$ are clamped to the power source line 12. That is, the second logic level of these points $P_1$, $P_2$, and $P_3$ is set to $V_{SS}$, for example, 0 V. Accordingly, hatched portions in the word address register group 18 and the write amplifier group 17 are not used. Non-clamped input terminals are connected to the logic block. In this figure, only two input terminals are shown as connections to the logic block in order to simplify the drawing. A more detailed explanation will be given regarding the above with reference to FIG. 4.

Figure 4:
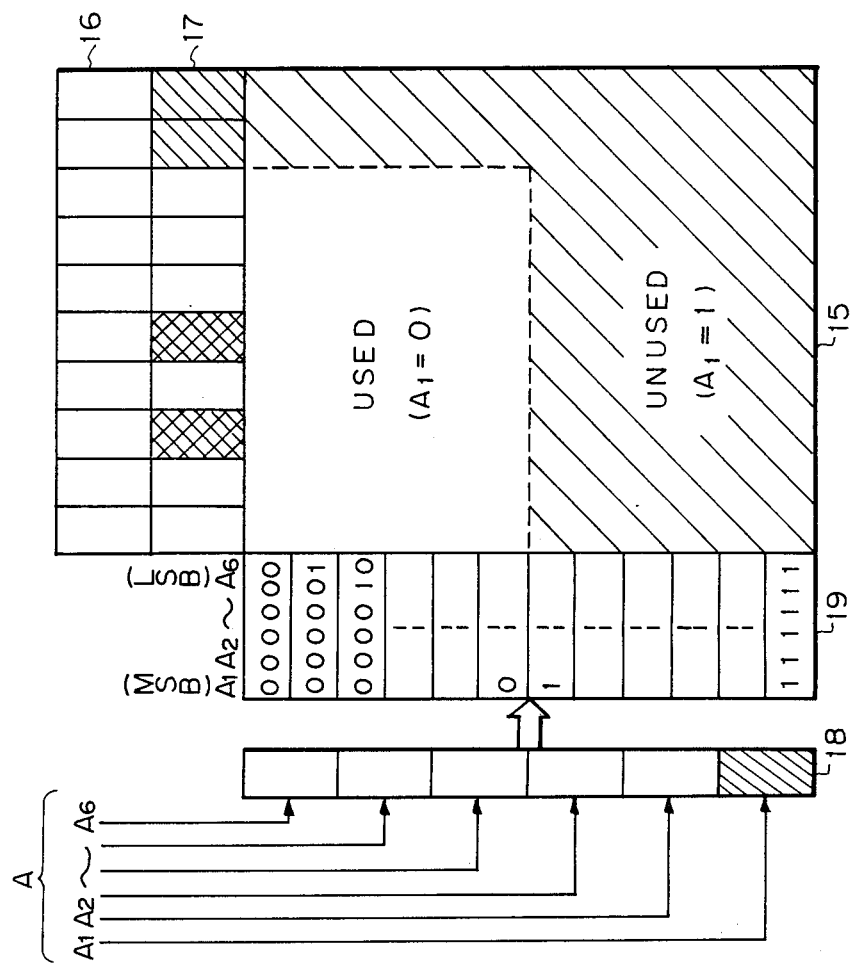
FIG. 4 is a schematic view for explaining used and unused memory areas.

FIG. 4 is a schematic view for explaining used and unused memory areas. Assuming that the memory circuit 1 includes 64-word, 10-bit memory cells, the word address signal A comprises 6 bits ($A_1$ to $A_6$) and each of the sense and write amplifier groups 16 and 17 comprises 10 units. In this case, assuming that the memory capacity required by the customer is 32 words and 8 bits, the word address signal A must be 5 bits and each of the sense and write amplifiers groups 16 and 17 must be 8 units. That is, the most significant bit (MSB) $A_1$ of the address signal A is set to "0", and the memory area to be used is determined by the most significant bit $A_1$. Accordingly, when the most significant bit $A_1$ is set at "0", the memory area shown by the hatched lines is not used as a memory area.

Also, one bit portion of the address register group 18 shown by the hatched lines and two bit portions of the write amplifier group 17 shown by the hatched lines are not used in this case. As can be understood, the remaining input terminals are used for the logic operation. The output terminals corresponding to the clipped input terminals need not be clipped and may remain as open terminals because no output signals are applied to such unused output terminals.

Moreover, it is possible to select the clipping point of the input terminal in accordance with wiring space conditions. For example, the two cross-hatched portions of the write amplifier group 17 correspond to the clamped input terminals. These write amplifiers are not used for the logic operation. The address signals $A_2$ to $A_6$ are used for designating an address in the used memory area. LSB is the lowest significant bit.

Figure 5:
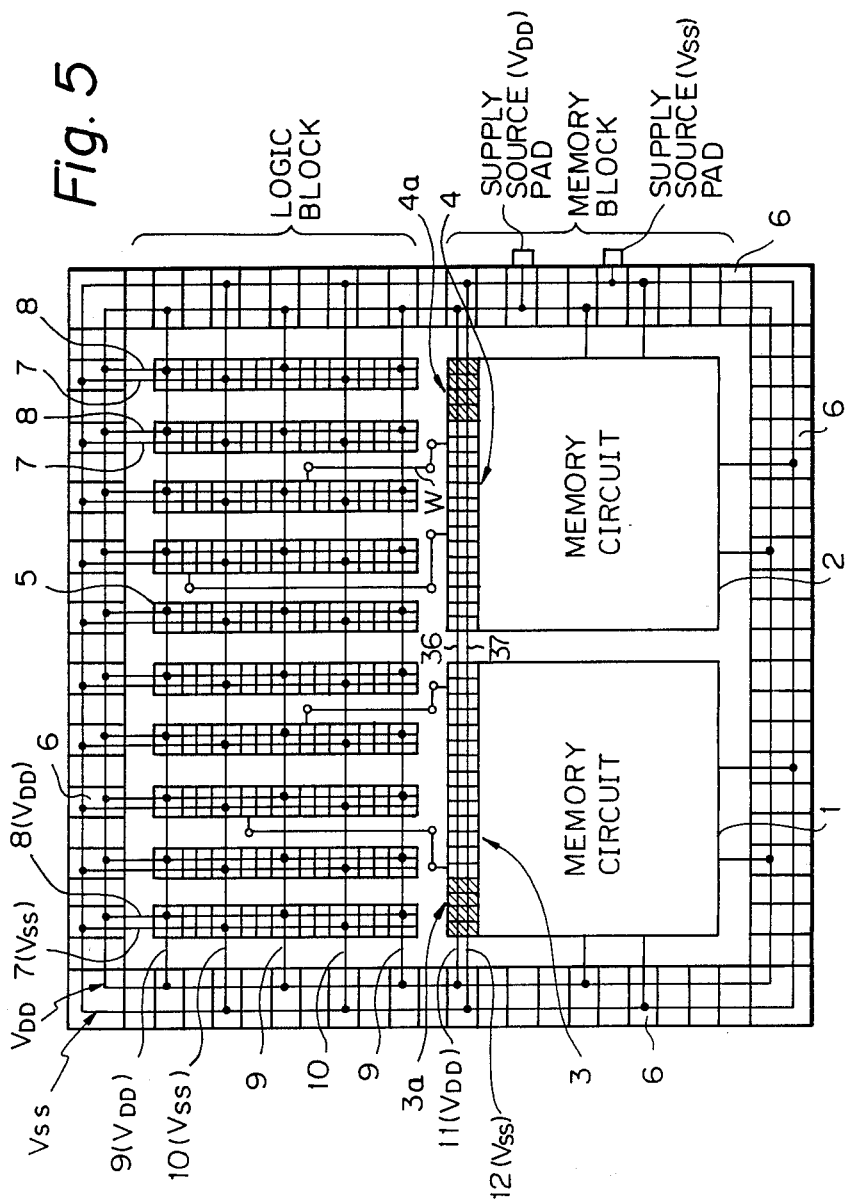
FIG. 5 is a schematic view of a gate array LSI according to another embodiment of the present invention.

FIG. 5 is a schematic view of a gate array LSI device on a semiconductor chip according to another embodiment of the present invention. In FIG. 5, reference numerals the same as in FIG. 1 represent the same elements. Reference numerals 3 and 4 represent basic cell rows. Each of the basic cell rows 3 and 4 is provided to each memory circuit 1 and 2 and is used for clamping and as an input portion of an additional circuit element. For example, the hatched portions 3a and 4a of the basic cell rows 3 and 4 are used for clamping, and the other portions (non-hatched portions) are used as input circuits. That is, the basic cells in the logic block are used as first basic cells, and the basic cell rows 3 and 4 are used as second basic cells. Each of the second basic cells has the same structure as the first one. In the hatched basic cells, the input terminals of basic cells are connected (clamped) to the power source line 36 or 37 which is formed by the first conductive layer, for example, polycrystalline silicon. These lines 36 and 37 are connected to the lines 11 and 12 of the second conductive layer through the contact holes P, shown in FIG. 6.

Figure 6:
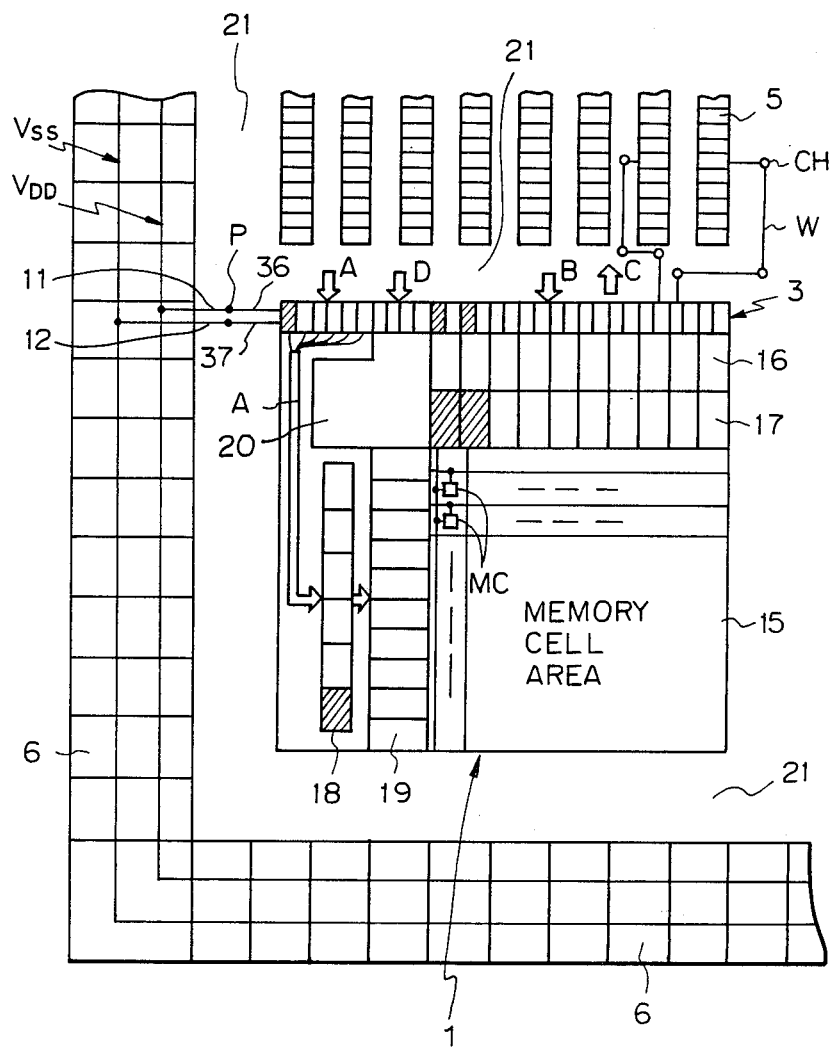
FIG. 6 is a detailed partial view of the memory circuit shown in FIG. 5.

FIG. 6 is a detailed partial view of the memory circuit shown in FIG. 5. In FIG. 6, reference numerals the same as in FIG. 3 represent the same elements. As explained above, the hatched portions of the basic cell row 3 are clamped to the power source lines 36 and 37 in accordance with customer requirements. The same explanations as given for FIGS. 3 and 4 regarding used and unused memory areas apply to FIG. 6. Incidentally, power source lines $V_{DD}$ and $V_{SS}$ to the memory block are omitted in order to simply the drawing. The word and bit lines are also omitted.

Figure 7A:
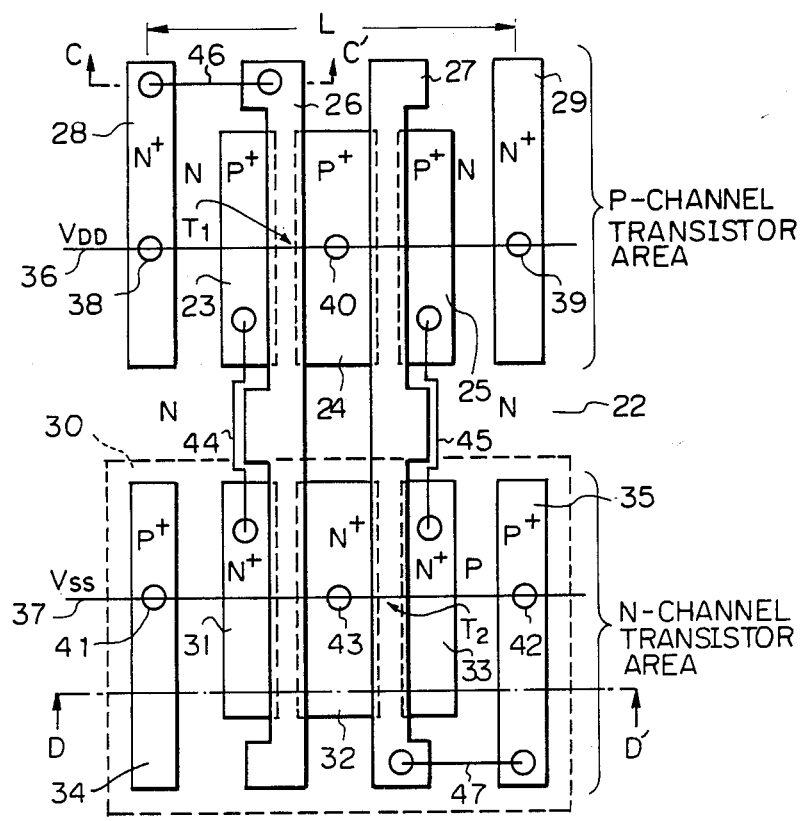
FIG. 7A is a schematic plan view of the structure of the basic cell.
Figure 7B:
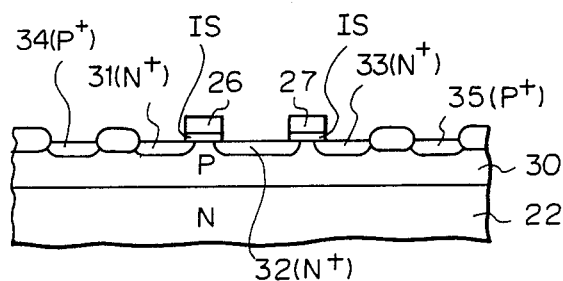
FIG. 7B is a sectional view of the basic cell taken along line D—D' in FIG. 7A.
Figure 7C:
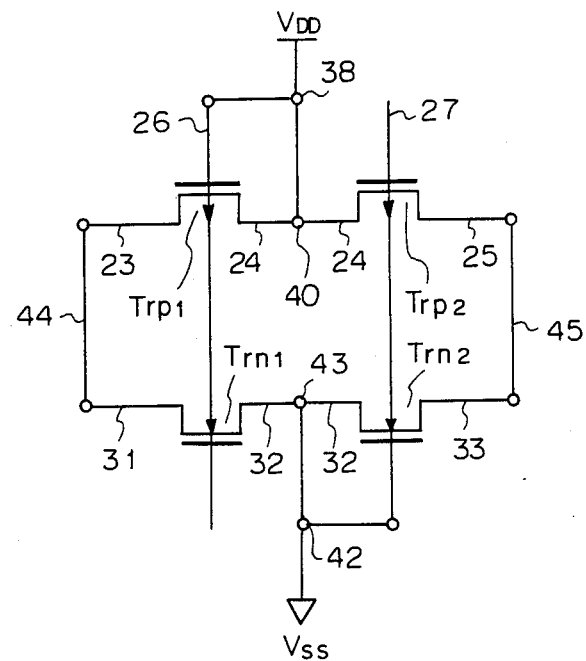
FIG. 7C is a circuit of the basic cell shown in FIG. 7A.

FIG. 7A is a schematic plan view of the structure of the basic cell and the wiring; FIG. 7B is a sectional view of the basic cell taken along line D—D' shown in FIG. 7A; and FIG. 7C is a basic circuit of the basic cell shown in FIG. 7A. In FIG. 7A, reference character L represents an area of one basic cell of the basic cell rows. P-channel and N-channel transistors are used as the basic cells in the area L.

In the P-channel transistor area, the transistor area is formed by P+ type diffusion layer portions 23, 24, and 25 on the N type semiconductor substrate 22. Reference numerals 26 and 27 represent gate conductive layer portions consisting of, for example, polycrystalline silicon, each forming gate electrodes. These gate conductive layer portions 26 and 27 also form the gate electrodes of the N-channel transistor. Reference numerals 28 and 29 represent N+ type substrate contact areas connected to the semiconductor substrate 22.

In the N-channel transistor area, the transistor area is formed by N+ type diffusion layer portions 31, 32, and 33 and P+ type substrate contact areas 34 and 35, these diffusion layer portions and substrate contact areas being formed on the P type well 30. A sectional view of the N-channel transistor area taken along line D—D' is given in FIG. 7B. In FIG. 7B, reference characters IS represent the insulation layers.

Power source lines 36 and 37 consisting of, for example, polycrystalline silicon are provided transversely above each of the gate conductive layer portions 26 and 27 through an insulation layer. The power source line 36 is used for supplying source voltage $V_{DD}$, for example, 5 V, and the power source line 37 is used for supplying source voltage $V_{SS}$, for example, 0 V as explained above. Moreover, the power source line 36 is connected to the N+ type substrate contact areas 28 and 29 and to the P+ type diffusion layer portion 24 through the contact holes 38, 39, and 40. The power source line 37 is connected to the P+ type substrate contact areas 34 and 35 and N+ type diffusion layer portion 32 through contact holes 41, 42, and 43. In this case, the substrate contact areas 28, 29, 34, and 35 are connected to the power source lines 36 and 37 through the contact holes 38, 39, 41, and 42 at a slice process using the master slice method. Accordingly, as shown in FIG. 7C, in the P-channel transistor area, the P+ type diffusion layer portion (source of transistor) 24 is connected to the power source $V_{DD}$ through the contact hole 40, and two P-channel transistors $T_{rp1}$ and $T_{rp2}$ are formed on the N type semiconductor substrate 22. In the N-channel transistor area, the N+ type diffusion layer (source of transistor) 32 is connected to the power source $V_{SS}$ through the contact hole 43, and two N-channel transistors $T_{rn1}$ and $T_{rn2}$ are formed on the P type well 30. Moreover, the P+ type diffusion layer portions 23 and 25 are connected to the N+ type diffusion layer portions 31 and 33 through the aluminum wiring 44 and 45. Accordingly, two sets of complementary metal insulator semiconductor (CMIS) inverters are formed by the P-channel and N-channel transistors having common gate electrodes. These inverters are included in the one basic cell area L.

Figure 7D:
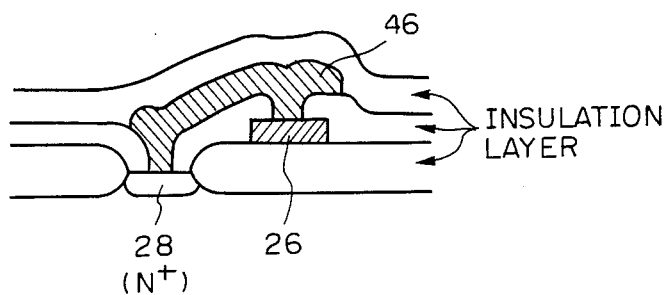
FIG. 7D is a sectional view of the gate conductive layer and N+ type substrate contact area taken along line C—C' shown in FIG. 7A.

FIG. 7D is a sectional view of the gate conductive layer and the N+ type substrate contact area 28 taken along line C—C' in FIG. 7A. As is obvious from the drawing, since the gate conductive layer portion 26 is connected to the N+ type substrate contact area 28 through the aluminum wiring 46 and the N+ type substrate contact area 28 is connected to the power source line 36, the input terminal of the inverter having a common gate conductive layer portion 26 with the gate electrode is clamped to the source voltage $V_{DD}$. Since the gate conductive layer portion 27 is connected to the P+ type substrate contact area 35 through the aluminum wiring 47 and the P+ type substrate contact 35 is connected to the power source line 37, the input terminal of the other inverter made of the same gate conductive layer portion 27 as the gate electrode is clamped to the source voltage $V_{SS}$.

As can be understood, it is possible to clamps the selected input terminal of the basic cell to a predetermined first or second logic level in a short length of wiring by using this method.

Consideration has been given to clamp the power source line 36 to the gate conductive layer portion 26 at the area $T_1$ instead of the wiring 46 and to clamp the power source line 37 to the gate conductive layer portion 27 at the area $T_2$ instead of the wiring 47. This turns out to be difficult, however, because the layer portions 26 and 27 are very narrow and thin and, moreover, the gate insulation layer provided under the conductive layer is very narrow and thin. If the gate conductive layer portions 26 and 27 are made wider so as to allow provision of a contact hole, the logic characteristic of the inverter conversely deteriorates. Therefore, it is technically difficult to directly provide a contact hole at the area $T_1$ and $T_2$ to these gate conductive layer portions 26 and 27.

Figure 8:
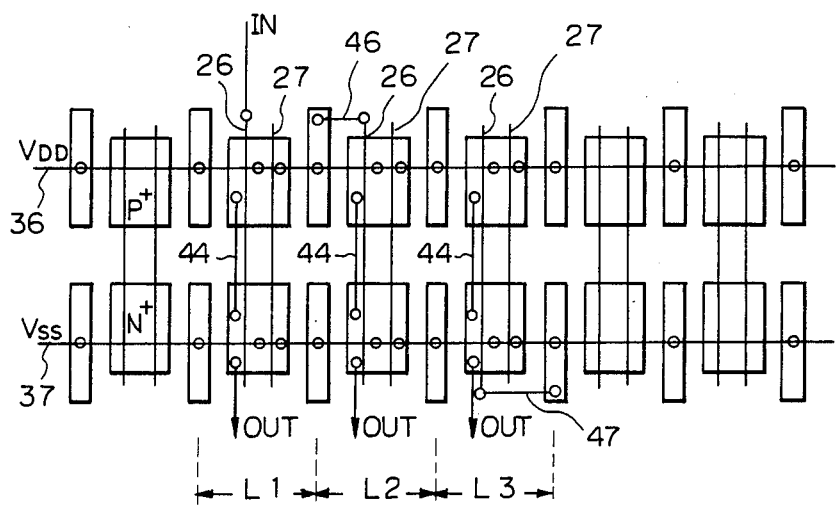
FIG. 8 is a schematic wiring view of the basic cell rows shown in FIGS. 5 and 6.

FIG. 8 is a schematic wiring view of the basic cell rows shown in FIGS. 5 and 6. In FIG. 8, reference letters $L_1$, $L_2$, and $L_3$ indicate elements corresponding to the basic cell area L shown in FIG. 7A. In this case, the basic cell area $L_1$ is used as the CMIS inverter, the basic cell area $L_2$ is used as a basic cell in which the input terminal is clamped to the source voltage $V_{DD}$ through the wiring 46, and the basic cell area $L_3$ is also used as a basic cell in which the input terminal is clamped to the other source voltage $V_{SS}$ through the wiring 47.

FIG. 9 is a schematic view of a gate array LSI device on a semiconductor chip according to still another embodiment of the present invention. In FIG. 9, reference numerals the same as in FIGS. 1 and 5 represent the same elements. Reference numerals 5a and 5b (hatched portions) represent stacked gates. In this embodiment, any basic cell (or cells) may be used as a so-called stacked gate for clamping. This stacked gate is connected (clamped) to the input terminal of the memory block at the clamping point CP.

In general, a stacked gate is a basic cell with an output terminal connected to a power source line so that the predetermined potential is output therefrom. As shown in FIG. 9, the basic cell rows 3 and 4 shown in FIG. 5 can be eliminated and the stacked gates connected to the input terminals of the memory block. These input terminals are connected to each other. Moreover, alternatively, each stacked gate can be directly connected to a specific pattern (not shown) of the memory block.

Figure 10A:
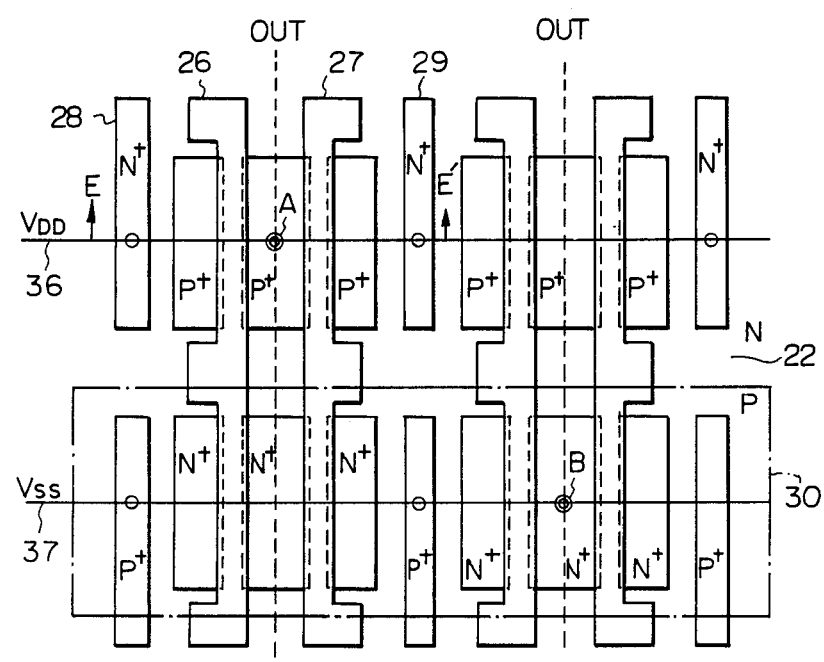
FIG. 10A is a schematic plan view of the structure of stacked gates shown in FIG. 9.

FIG. 10A is a schematic plan view of the structure of the stacked gate shown in FIG. 9, and FIG. 10B is a sectional view of the stacked gate taken along line E—E' in FIG. 10A.

In FIG. 10A, the power source line $V_{DD}$ is connected to the output line (dotted line) on the grid of the basic cell through the contact hole A. Similarly, the power source line $V_{SS}$ is also connected to the output line (dotted line) on the other grid of the basic cell through the contact hole B.

As is obvious from FIG. 10B, the power source line $V_{DD}$ (first conductive layer of the aluminum wiring) is connected to the output (second conductive layer of the aluminum wiring) through the contact hole A. The contact hole B has the same sectional structure as that of FIG. 10B. The input terminals can be clamped to the predetermined logic level, for example, $V_{DD}$ or $V_{SS}$, by connecting the output terminal of the stacked gate and the input terminal of the memory block.

Figure 11:
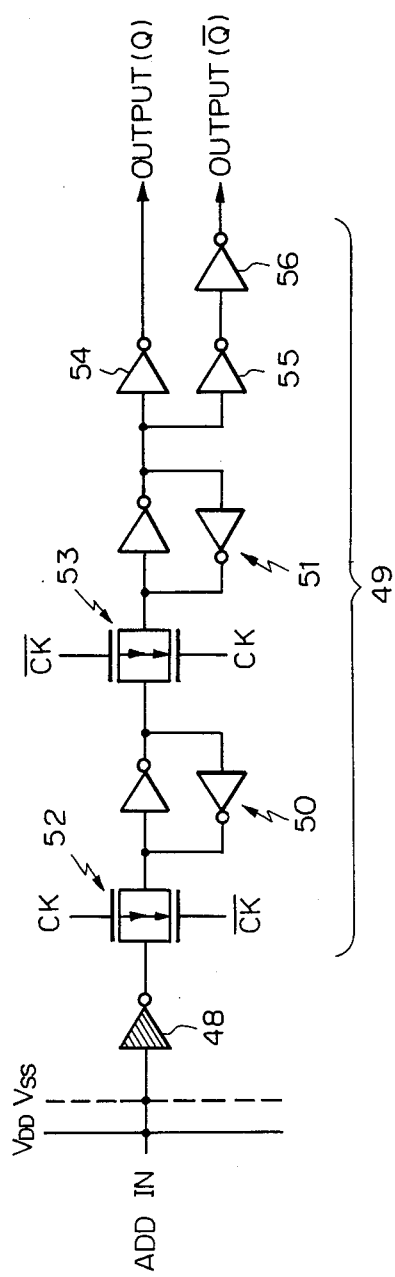
FIG. 11 is a schematic block diagram of the word address register shown in FIGS. 3, 4 and 6.

FIG. 11 is a schematic block diagram of the word address register group 18 shown in FIGS. 3, 4, and 6. In FIG. 11, the inverter 48 (hatched line) is used as the input buffer and, for example, is formed by the basic cell shown in FIG. 8, in the case of the second embodiment. However, in the case of the first embodiment, the inverted 48 is provided for the register group 18. The address register section 49 connected to the inverter 48 is constituted of a plurality of transfer gates 52, 53, flip-flop circuits 50, 51, and inverters 54, 55, and 56.

The section 49 is also formed by a specific pattern in the memory circuit. In FIG. 11, each of the the transfer gates 52 and 53 receives a clock signal CK or an inverted clock signal $\overline{CK}$. Each of the transfer gates 52 and 53 is turned on by these clock signals CK or $\overline{CK}$. An output signal Q and an inverted output signal $\overline{Q}$ are obtained by a corresponding address signal of the high or low level when the transfer gates 52 and 53 or turned on. The flip-flop circuits 50 and 51 are used for a flip-flop function. The inverters 54, 55, and 56 are used for inversion of signals.

As explained above, the selected input terminal of the inverter is clamped to the power source lines $V_{DD}$ or $V_{SS}$ without floating the input terminal when it is not used. This will be explained in more detail with reference to FIG. 12.

Figure 12:
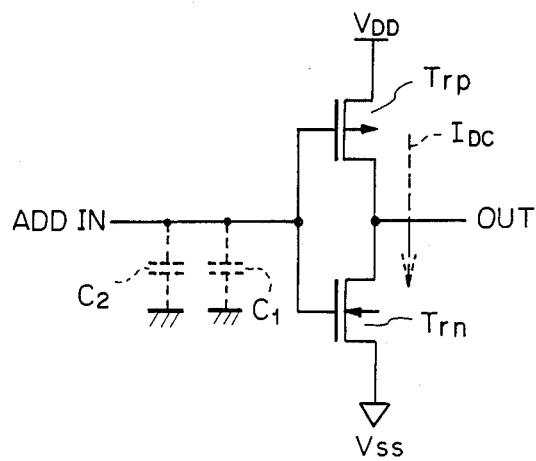
FIG. 12 is a circuit of a typical inverter for explaining the necessity of clamping the input terminal.

A typical complementary metal oxide semiconductor (CMOS) inverter is shown in FIG. 12. This inverter outputs a high or low level signal corresponding to the input address signal based on the turning on or off of the transistors $T_{rp}$ and $T_{rn}$. In this case, when the input terminal becomes floating, the transistor $T_{rp}$ or $T_{rn}$ is accidentally turned on by the potential caused by coupling capacities $C_1$ and $C_2$ between the input wirings. Consequently, a very small direct current $I_{DC}$ flows from the lines $V_{DD}$ to $V_{SS}$. This direct current $I_{DC}$ causes an error in later logic operations and increases total power consumption of the LSI.

As can be understood from the above explanations, the master slice type semiconductor circuit device according to the present invention is very suitable for the design of wiring patterns by computer aided design (CAD). This is because it is not necessary to prepare and previously register information for the wiring pattern of the memory circuits 1 and 2 in a library of the CAD system for every required memory structure.

That is, according to the present invention, only one kind of information of the wiring pattern of the memory circuits 1 and 2 is previously registered in the library of the CAD system, and it is possible to realize the required memory structure by only supplying position information for the contact hole to the CAD system.

We claim:

1. A master slice type semiconductor circuit device, comprising:
    at least one memory circuit block having a plurality of input circuits receiving an address signal and a peripheral portion;
    a plurality of fixed position input lines provided at the peripheral portion of said memory circuit block and connected to said input circuits respectively for receiving input signals, said input lines being formed in parallel in a first direction and of a first conductive layer;
    a first fixed position conductive line provided at the peripheral portion of said memory circuit block, extending in a second direction, intersecting each input line creating points of intersection, and for supplying a first voltage having a first logic level;
    a second fixed position conductive line provided extending in the second direction, intersecting each input line creating points of intersection and for supplying a second voltage having a second logic level, said first and second conductive lines being formed of a second conductive layer which is a different layer from said first conductive layer; and
    contact means, at the points of intersection, for connecting one of said first or second conductive lines to at least one of said input lines, the address signal being provided to the input lines not connected to said first or second conductive lines;
    wherein a potential of at least one of said input signals is clamped to one of said first and second logic levels by said contact means, thereby changing one of memory capacity and function of said memory block.

2. A master slice type semiconductor circuit device as claimed in claim 1, wherein said first and second conductive lines intersect each of said input lines.

3. A master slice type semiconductor circuit device as claimed in claim 1, wherein said memory circuit block comprises metal insulator semiconductor (MIS) transistors having gate electrodes, said second conductive layer is the same layer as the gate electrode layer forming said gate electrodes of said MIS transistors, and said first and second conductive lines are disposed under said input lines.

4. A master slice type semiconductor circuit device as claimed in claim 1, wherein said first conductive layer is aluminum and said second conductive layer is polycrystalline silicon.

5. A master slice type semiconductor circuit device as claimed in claim 1, wherein said contact means comprises a contact hole formed between said first conductive layer and said second conductive layer.

6. A master slice type semiconductor circuit device as claimed in claim 1, wherein said device further comprises: a logic circuit block, having a plurality of first basic cells for forming a desired logic circuit, and a plurality of second basic cells, each of which has the same structure as said first basic cells, disposed in said peripheral portion of said memory circuit block for forming a part of said input circuit, each of said second basic cells including at least one MIS transistor having a gate electrode as one of said input lines.

7. A master slice type semiconductor circuit device as claimed in claim 6, wherein said gate electrode of said MIS transistor in each second basic cell is disposed under said first and second conductive lines, and said gate electrode intersects said first and second conductive lines.

8. A gate array type large-scale integrated circuit master slice device, comprising:
    a logic block having a plurality of basic cells arranged in a grid and producing an address signal;
    a memory block having at least one memory circuit and peripheral portions;
    fixed position input terminals formed of a first conductive layer, provided at the peripheral portions of said memory circuit, extending parallel and in a first direction, and operatively connected to said memory block and said logic block;
    a pair of fixed position power source lines provided at said peripheral portions of said memory circuit extending in a second direction, intersecting said input terminals forming intersection points and formed of a second conductive layer different from said first conductive layer of said input terminals; and
    at least one contact hole located at one of the intersection points, connecting said first conductive layer and said second conductive layer at a selected one of the input terminals, said input terminals not connected to said power source lines receiving the address signal;
    wherein said selected input terminal connected by said contact hole is set to a predetermined logic level by a selected one of said power source lines, thereby changing one of memory capacity and function of said memory block.

9. A gate array type large-scale integrated circuit device as claimed in claim 8, wherein each said power source line comprises a gate conductive layer under the input terminals.

10. A gate array type large-scale integrated circuit device as claimed in claim 8, wherein said at least one contact hole is used for connecting said gate conductive layer and the selected one of said input terminals.

11. A gate array type large-scale integrated circuit device as claimed in claim 8, wherein said selected input terminal is clamped to said power source line by using said contact hole.

12. A gate array type large-scale integrated circuit device as claimed in claim 8, wherein said first and second conductive layers comprises aluminum wiring.

13. A gate array type large-scale integrated circuit device as claimd in claim 12, wherein said logic block includes second aluminum wiring and said first aluminum wiring is connected to said second aluminum wiring of said logic block using said contact hole.

14. A gate array type large-scale integrated circuit device as claimed in claim 8, wherein said memory circuit comprises:

a memory cell array comprising a plurality of memory cells;
a sense amplifier group comprising a plurality of sense amplifiers operatively connected to said input terminals;
a write amplifier group comprising a plurality of write amplifiers operatively connected to said sense amplifiers and said memory cell array;
a word address register group comprising a plurality of word address registers operatively connected to said input terminals;
a word decoder group comprising a plurality of word decoders operatively connected to said word address registers and said memory cell array; and
a control circuit operatively connected to said word decoders, said write amplifier and said input terminals.

15. A gate array type large-scale integrated circuit device as claimed in claim 14, wherein the memory area of said memory cell array is determined by an address signal through said word address register group and word decoder group.

16. A gate array type large-scale integrated circuit master slice device, comprising:
a logic block having a plurality of basic cells arranged in a grid and producing an address signal;
a memory block having at least one memory circuit and peripheral portions;
an input basic cell row provided at said peripheral portions of said memory circuit at a layer of a basic cell, operatively connected to said memory block and said logic block and having input basic cells provided in parallel to a row direction and transferring the address signal to said memory block;
fixed position power source lines provided at said peripheral portions of said memory circuit and formed of a first conductive layer above the basic cell level of said basic cell, extending in the row direction and intersecting each input basic cell in said input basic cell row producing intersection points; and
at least one contact hole, located at one of said intersection points, for connecting one of said power source lines and a selected input basic cell, said input basic cells of said basic cell row not connected to said power source lines receiving the address signal;
wherein said selected input basic cell connected by said contact hole is set to a predetermined logic level by the one of said power source lines, thereby changing one of memory capacity and function of said memory block.

17. A gate array type large-scale integrated circuit device as claimed in claim 16, wherein said memory circuit comprises:
a memory cell array comprising a plurality of memory cells;
a sense amplifier group comprising a plurality of sense amplifiers operatively connected to said input basic cell row;
a write amplifier group comprising a plurality of write amplifiers operatively connected to said memory cell array and said sense amplifiers;
a word address register group comprising a plurality of word address registers operatively connected to said input basic cell row;
a word decoder group comprising a plurality of word decoders operatively connected to said memory cell array and said word address registers; and
a control circuit operatively connected to said input basic cell row, said sense amplifiers, said write amplifiers and said word decoders.

18. A gate array type large-scale integrated circuit device as claimed in claim 16, wherein said power source lines comprise aluminum wiring above said basic cell row level.

19. A gate array type large-scale integrated circuit device as claimed in claim 16, wherein said at least one contact hole is used for connecting said power source lines and one of a P+ and an N+ type substrate contact area.

20. A gate array type large-scale integrated circuit device as claimed in claim 16, wherein said at least one contact hole is used for connecting said power source lines and one of a P+ and an N+ type diffusion layer.

21. A gate array type large-scale integrated circuit device as claimed in claim 20, wherein said diffusion layer of said selected input basic cell is claimed to the one of said power source lines by using said contact hole.

22. A gate array type large-scale integrated circuit master slice device, comprising:
a logic block having a plurality of basic cells and at least one stacked gate, the basic cells being arranged in a grid and producing an address signal;
a memory block having at least one memory circuit;
an input basic cell row including input basic cells provided in a row and parallel to a row direction, forming input circuits connecting said memory block and said logic block, and transferring the address signal;
power source lines provided for said logic block and formed of first and second conductive layers of aluminum wiring intersecting said input basic cells forming intersection points; and
at least one contact hole, located at one of the intersection points, for connecting between one of said power source lines and said stacked gate, said input basic cells not connected to said power source lines receiving the address signal from said logic block;
wherein said stacked gate connected by said contact hole is set to a predetermined logic level by the one of said power source lines, thereby changing one of memory capacity and function of said memory block.

23. A gate array type large-scale integrated circuit device as claimed in claim 22, wherein said memory block further comprises input terminals in peripheral portions for said stacked interconnecting gate and said memory circuit using said contact hole.

24. A gate array type large-scale integrated circuit device as claimed in claim 22, wherein said at least one contact hole is used for connecting between said power source line and one of a P+ and an N+ type substrate contact area.

* * * * *

UNITED STATES PATENT AND TRADEMARK OFFICE
CERTIFICATE OF CORRECTION

PATENT NO. : 4,780,846

DATED : October 25, 1988

INVENTOR(S) : Tanabe et al.

It is certified that error appears in the above-identified patent and that said Letters Patent is hereby corrected as shown below:

Col. 7, line 31, "clamps" should be --clamp--;

line 35, "clamp" should be --clamping-- line 37, "clamp" should be --clamping--.

Col. 12, line 25, "claimid" should be --clamped--.

Signed and Sealed this

Sixteenth Day of May, 1989

Attest:

DONALD J. QUIGG

*Attesting Officer*      *Commissioner of Patents and Trademarks*